(12) United States Patent
Miyake et al.

(10) Patent No.: US 9,735,149 B2
(45) Date of Patent: Aug. 15, 2017

(54) SCHOTTKY BARRIER DIODE

(71) Applicant: TOYOTA JIDOSHA KABUSHIKI KAISHA, Toyota-shi, Aichi-ken (JP)

(72) Inventors: Hiroki Miyake, Toyota (JP); Tatsuji Nagaoka, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/163,813

(22) Filed: May 25, 2016

(65) Prior Publication Data

US 2016/0351560 A1    Dec. 1, 2016

(30) Foreign Application Priority Data

May 27, 2015    (JP) ................................. 2015-107058

(51) Int. Cl.
| | | |
|---|---|---|
| *H01L 29/15* | (2006.01) |
| *H01L 31/0312* | (2006.01) |
| *H01L 27/06* | (2006.01) |
| *H01L 29/78* | (2006.01) |
| *H01L 29/872* | (2006.01) |
| *H01L 29/16* | (2006.01) |
| *H01L 29/36* | (2006.01) |

(Continued)

(52) U.S. Cl.
CPC ...... *H01L 27/0629* (2013.01); *H01L 29/0619* (2013.01); *H01L 29/0649* (2013.01); *H01L 29/1608* (2013.01); *H01L 29/36* (2013.01); *H01L 29/407* (2013.01); *H01L 29/7813* (2013.01); *H01L 29/872* (2013.01)

(58) Field of Classification Search
CPC ............ H01L 27/0629; H01L 29/1608; H01L 29/872; H01L 29/7813
See application file for complete search history.

(56) References Cited

U.S. PATENT DOCUMENTS

| | | | | |
|---|---|---|---|---|
| 8,704,295 B1 * | 4/2014 | Darwish | ............. | H01L 29/7806 257/330 |
| 2005/0230744 A1 * | 10/2005 | Wu | ..................... | H01L 29/0623 257/330 |
| 2011/0227630 A1 * | 9/2011 | Shinoda | .............. | H01L 29/7806 327/434 |

FOREIGN PATENT DOCUMENTS

| | | | | |
|---|---|---|---|---|
| JP | 2006/210392 | * | 8/2006 | ........................ 27/6 |
| JP | 2006-210392 A | | 8/2006 | |

(Continued)

*Primary Examiner* — Victor A Mandala

(74) *Attorney, Agent, or Firm* — Andrews Kurth Kenyon LLP

(57) ABSTRACT

An SBD includes a semiconductor substrate; an anode electrode which is in Schottky contact with a front surface of the semiconductor substrate; and a cathode electrode which is in ohmic contact with a rear surface of the semiconductor substrate. A trench extending from the front surface of the semiconductor substrate toward the rear surface of the semiconductor substrate is provided in the semiconductor substrate, and an inner surface of the trench is covered with an insulating film. An insulating layer is deposited at a deep portion of the trench, and a conductive layer is deposited at a shallow portion of the trench. An n-type front surface region in contact with the anode electrode, an n-type rear surface region in contact with the cathode electrode, and an n-type intermediate region connecting the front surface region and the rear surface region are provided in the semiconductor substrate.

4 Claims, 6 Drawing Sheets

(51) Int. Cl.
*H01L 29/40* (2006.01)
*H01L 29/06* (2006.01)

(56) References Cited

FOREIGN PATENT DOCUMENTS

| | | |
|---|---|---|
| JP | 2007-311822 A | 11/2007 |
| JP | 2010-147399 A | 7/2010 |
| JP | 2013-115394 A | 6/2013 |

* cited by examiner

SCHOTTKY BARRIER DIODE

CROSS-REFERENCE TO RELATED APPLICATION

This application claims priority to Japanese Patent Application No. 2015-107058 filed on May 27, 2015, the entire contents of which are hereby incorporated by reference into the present application.

TECHNICAL FIELD

The present teachings disclose an SBD (Schottky Barrier Diode).

DESCRIPTION OF RELATED ART

An SBD can be obtained by allowing an n-type semiconductor substrate to have an anode electrode that is in Schottky contact with a front surface of the semiconductor substrate, and a cathode electrode that is in ohmic contact with a rear surface of the semiconductor substrate. The SBD has a problem of a leakage current that easily flows therein, and an art to suppress the leakage current is disclosed in Japanese Patent Application Publication No. 2006-210392. The art in Japanese Patent Application Publication No. 2006-210392 adopts configurations described below:
(1) A trench extending from a front surface of a semiconductor substrate toward a rear surface of the semiconductor substrate is formed in the semiconductor substrate.
(2) An inner surface of the trench is covered with an insulating film.
(3) An insulating layer is deposited at a deep portion of the trench having its inner surface covered with the insulating film.
(4) A conductive layer is deposited at a shallow portion of the trench having its inner surface covered with the insulating film.
(5) A p-type region is formed in a range in contact with a bottom surface of the trench.
When the above-described configurations are adopted, the leakage current can be suppressed while a voltage resistance of the SBD is secured.

SUMMARY

With the art in Japanese Patent Application Publication No. 2006-210392, the leakage current can be suppressed while the voltage resistance of the SBD is secured. However, it was revealed that characteristics of the SBD were unstable and easily changed with time. Moreover, as described in Japanese Patent Application Publication No. 2006-210392, an SBD and a MOS (a MOSFET) may be provided in the same semiconductor substrate in some cases. In this case, a potential applied to a gate electrode of the MOS is used to control ON/OFF of the MOS. There had been some cases where an operation of the SBD became unstable at switching of the ON/OFF, resulting in the voltage resistance of the SBD being impaired, and/or a large leakage current flowing.

A study on the cause of the above-described phenomenon revealed that, in the conventional art, this phenomenon was caused by the p-type region being brought into a floating state, and having an unstable potential which varied with time. It was revealed that, particularly in the case where the SBD and the MOS were provided in the same semiconductor substrate, the potential applied to the gate electrode of the MOS caused variations in the potential of the p-type region, thereby causing variations in the characteristics of the SBD. An art disclosed in the present teachings has been created based on the above-described findings.

An SBD disclosed in the present teachings comprises: a semiconductor substrate; an anode electrode which is in Schottky contact with a front surface of the semiconductor substrate; and a cathode electrode which is in ohmic contact with a rear surface of the semiconductor substrate. In the semiconductor substrate, a trench extending from the front surface of the semiconductor substrate toward the rear surface of the semiconductor substrate is provided, and an inner surface of the trench is covered with an insulating film. An insulating layer is deposited at a deep portion of the trench having its inner surface covered with the insulating film, and a conductive layer is deposited at a shallow portion of that trench. In the semiconductor substrate, an n-type front surface region in contact with the anode electrode, an n-type rear surface region in contact with the cathode electrode, and an n-type intermediate region connecting the front surface region and the rear surface region are provided. Furthermore, a p-type region is provided in a range in contact with a bottom surface of the trench, and a conduction path connecting the p-type region to the anode electrode is provided.

According to the above-described SBD,
(a) the conductive layer provided at the shallow portion of the trench operates like a field plate.
In other words, a depletion layer extends from the conductive layer, and a semiconductor region that exists between the trenches is pinched off. A JBSBD (Junction Barrier Schottky Barrier Diode) is obtained, and a leakage current is suppressed.
(b) In addition, the conductive layer extends along the trench in a depth direction, and hence the depletion layer also extends in the depth direction. A TMBSD (Trench MOS Barrier Schottky Diode) is obtained, and a high effect of suppressing the leakage current is obtained.
(c) The thick deposited insulating layer exists below the conductive layer, and hence electric field concentration is reduced, and a high voltage resistance is obtained.
(d) The depletion layer spreads from the p-type region to an n-type region, resulting in the leakage current further being suppressed, and the voltage resistance further being increased.
(e) In addition, the potential of the p-type region is not in the floating state, but is fixed to an anode potential, and hence the above-described phenomena are stably obtained, and the characteristics of the SBD are prevented from varying with time.

If a sidewall of the trench is inclined, a conduction path can be provided along the inclined sidewall, if a side surface of the trench is shaped as an inclined side surface that is inclined in a direction in which a width of the trench is wider as the inclined side surface is closer from a rear surface side to the front surface of the semiconductor substrate, impurities can be implanted from a front surface side of the semiconductor substrate into the inclined side surface, and the conduction path can be formed by the impurities thus implanted.

As disclosed in Japanese Patent Application Publication No. 2006-210392, an SBD and a MOS may be provided in the same semiconductor substrate in some cases. In this case, a trench gate electrode of the MOS and a conductive layer deposited at a shallow portion of a trench and that suppresses the leakage current of the SBD may be set at a same potential. In this case, it is particularly advantageous to fix the potential of the p-type region to an anode potential.

If the potential of the p-type region is in a floating state, the potential of the p-type region unstably varies at the switching of a potential of the gate electrode, causing unstable changes accordingly in the characteristics of the SBD. If the potential of the p-type region is fixed to the anode potential, unstable behaviors at the switching can be suppressed. The configuration in which the thick deposited insulating layer exists below the conductive layer is particularly advantageous in the above-described case. The conductive layer and the semiconductor region face each other via the thick deposited insulating layer, and hence a parasitic capacitance is decreased, and a speed at which the potential of the gate electrode changes can be enhanced.

As described in Japanese Patent Application Publication No. 2006-210392, a plurality of the SBDs and a plurality of MOSs may be provided in the same semiconductor substrate in some cases. In this case, the conductive layers deposited at the shallow portions of the trenches and that suppress the leakage current of the SBDs may serve as trench gate electrodes of the MOSs. In this case, the potential of the trench gate electrodes and the potential of the conductive layers resultantly become identical. If the potential of the p-type regions is fixed to the anode potential, unstable behaviors that occur when the MOSs are switched are suppressed. In this case as well, with use of the thick deposited insulating layers, the speed at which the potential of the gate electrodes changes can be enhanced. The details of the art disclosed in the present teachings and further improvements thereof will be described in the following "DETAILED DESCRIPTION".

DETAILED DESCRIPTION

Some of main features of embodiments described below will be enumerated.
(Feature 1) A width of a p-type region may be smaller than, equal to, or larger than a width of a trench.
(Feature 2) A conduction path connecting the p-type region and an anode electrode is a p-type impurity implanted region.
(Feature 3) A plurality of trenches extending in a stripe-like manner is provided, and a conduction path is provided at each trench.
(Feature 4) A p-type region is provided which encircles a circumference of the plurality of the stripe-like trenches and brings the p-type region provided in each stripe-like trench into conduction, and a conduction path common to the plurality of the stripe-like trenches is provided.
(Feature 5) A conduction path connecting the p-type region and the anode electrode is provided at a part corresponding to an outer contour of a range where an SBD is formed.

First Embodiment

Figure 1:
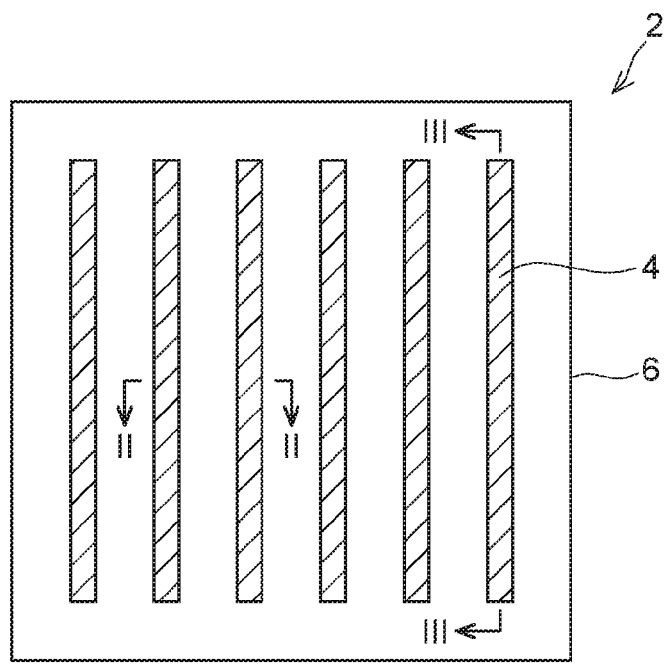
FIG. 1 is a plan view of an SBD of First Embodiment.
Figure 2:
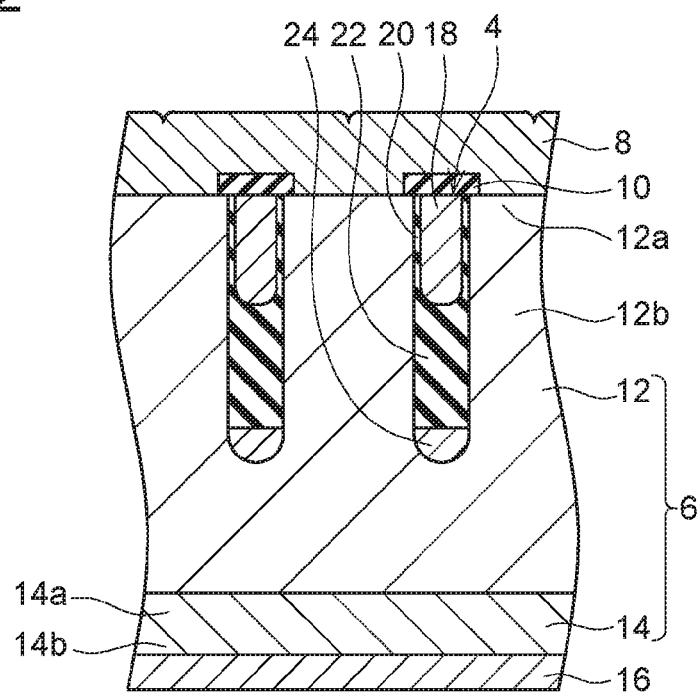
FIG. 2 is a cross-sectional view taken along a line II-II in FIG. 1.
Figure 3:
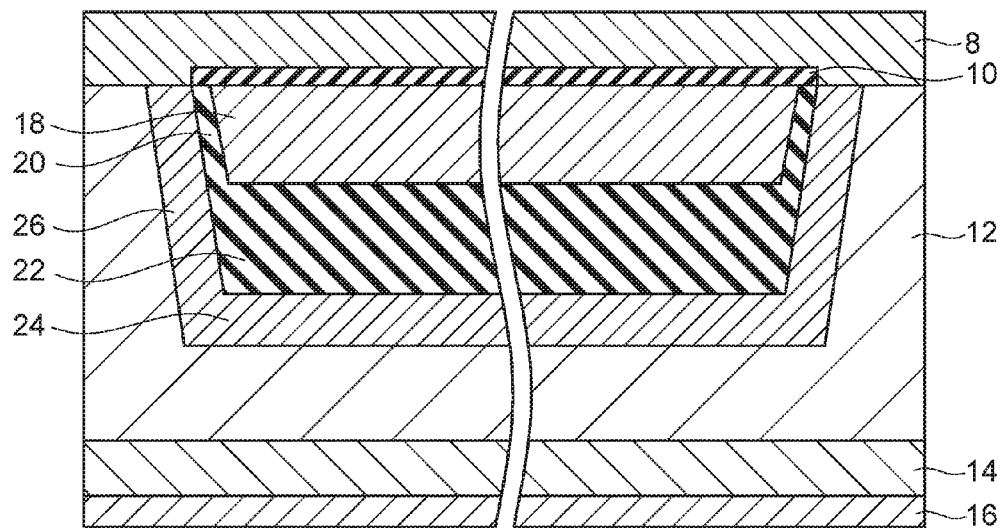
FIG. 3 is a cross-sectional view taken along a line III-III in FIG. 1.

FIG. 1 shows a plan view of a semiconductor substrate 6 that configures an SBD 2. As shown in FIGS. 2 and 3, in actuality, in the SBD 2, an anode electrode 8 and interlayer insulating films 10 are provided on a front surface of the semiconductor substrate 6. FIG. 1 shows the front surface of the semiconductor substrate 6, with the anode electrode 8 and the interlayer insulating films 10 being removed. As shown in FIG. 1, a plurality of stripe-like trenches 4 extending in parallel is provided in the front surface of the semiconductor substrate 6. Notably, the drawings are intended to provide easy understanding of the art, and dimensions and the like therein differ from products that are actually implemented.

As shown in FIGS. 2 and 3, each of the trenches 4 extends from the front surface toward a rear surface side of the semiconductor substrate 6. An inner surface (a side surface and a bottom surface) of the trench 4 is covered with a thermal oxide insulating film 20. The semiconductor substrate 6 is formed of SiC crystal, and when the semiconductor substrate 6 in which the trenches 4 are provided is heat-treated in an oxygen atmosphere, a $SiO_2$ film is formed on the inner surface of each trench 4. This $SiO_2$ film becomes the thermal oxide insulating film 20. An insulating layer 22 is deposited at a deep portion of each trench 4 having its inner surface covered with the thermal oxide insulating film 20. The insulating layer 22 can be deposited at the deep portion of the trench 4, by depositing a $SiO_2$ layer by a CVD method inside the trench 4 having its inner surface covered with the thermal oxide insulating film 20, and then etching to adjust a height of a front surface of the insulating layer thus deposited. FIG. 1 does not show boundaries each between the thermal oxide insulating film 20 and the insulating layer 22. In actuality, the thermal oxide insulating film 20 extends along the inner surface of each trench 4, and the insulating layer 22 is filled in the thermal oxide insulating film 20. A conductive layer 18 is deposited at a shallow portion of each trench 4 having its inner surface covered with the thermal oxide insulating film 20. The conductive layer 18 can be deposited at the shallow portion of the trench 4, by depositing a polysilicon layer by a CVD method inside the trench having its deep portion filled with the insulating layer 22 and then etching to adjust a height of a front surface of the polysilicon layer. Each of the interlayer insulating films 10 is provided on the front surface of the semiconductor substrate 6 in a range that covers a front surface of the corresponding trench 4. The anode electrode 8 is provided on the front surface of the semiconductor substrate 6 that is exposed between the interlayer insulating films 10, and on the interlayer insulating films 10. Each conductive layer 18 is insulated by the corresponding interlayer insulating film 10 from the anode electrode 8, and is insulated by the corresponding thermal oxide insulating film 20 from the semiconductor substrate 6.

The semiconductor substrate 6 is obtained by epitaxially growing an n-type SiC single crystal layer 12 on an n-type SIC single crystal substrate 14. The anode electrode 8 is formed of a metal having a material property that makes Schottky contact with the n-type SiC single crystal layer 12.

A cathode electrode 16 is provided on the rear surface of the semiconductor substrate 6. The cathode electrode 16 is formed of a metal having a material property that makes ohmic contact with the n-type SiC single crystal substrate 14.

The semiconductor substrate 6 comprises an n-type front surface region (i.e., a front surface neighboring region 12a of the n-type SiC single crystal layer 12, the region 12a being located in a range exposed on the front surface between the trenches 4) in contact with the anode electrode 8, an n-type rear surface region (i.e., a rear surface neighboring region 14b of the n-type SiC single crystal substrate 14, the region 14b being exposed on the rear surface) in contact with the cathode electrode 16, and an n-type intermediate region connecting the front surface region and the rear surface region (i.e., a region 12b of the SIC single crystal layer 12 that is other than the vicinity of the front surface and a region 14a of the SiC single crystal substrate 14 that is other than the vicinity of the rear surface).

A p-type region 24 is provided in a range in contact with the bottom surface of each trench 4. The p-type region 24 is at an intermediate depth of the SiC single crystal layer 12, and is covered with the SiC single crystal layer 12 and the corresponding thermal oxide insulating film 20.

As shown in FIG. 1, the trenches 4 extend long in upward and downward directions in FIG. 1. As shown in FIG. 3, inclined side surfaces are provided at both ends of each trench 4 in the upward and downward directions in FIG. 1. The inclined side surfaces of the trench 4 are inclined in a direction in which a length of the trench 4 becomes longer as each of the inclined side surfaces is closer to the front surface of the semiconductor substrate 6 in the plan view. In other words, each of the inclined sidewalls is oriented diagonally upward, and by implanting impurities from the front surface side of the semiconductor substrate 6, the impurities can be implanted into a range along the inclined side surfaces. A reference number 26 indicates a range where p-type impurities are implanted with a high concentration in the range along the inclined side surfaces. The range where the p-type impurities are implanted extends between the anode electrode 8 and the p-type region 24, brings the anode electrode 8 and the p-type region 24 into conduction, and makes the potential of the anode electrode 8 and the potential of the p-type region 24 equal to each other. The range where the p-type impurities are implanted with a high concentration becomes a conduction path 26 of the anode electrode 8 and the p-type region 24. If the range where the p-type impurities are implanted with the high concentration is provided at the sidewalls of each trench, a depletion layer does not spread beyond that range. In the present embodiment, the conduction path 26 is provided at a part corresponding to an outer contour of the SBD region, and hence the non-spreading of the depletion layer outside that part causes no deterioration in the characteristics of the SBD. Notably, a peripheral voltage resistant structure, not shown, is provided at an outer circumferential portion of the semiconductor substrate 6 in FIG. 1. For the peripheral voltage resistant structure, the well-known art such as a guard ring or a resurf layer can be implemented, and the description thereof will be omitted.

In the case of the above-described SBD 2, if there is a relation of (the potential of the anode electrode 8–a surface potential of the SiC single crystal layer 12)>a Schottky barrier between the anode electrode 8 and the SiC single crystal layer 12, a forward current flows from the anode electrode 8 to the cathode electrode 16. In contrast, if there is a relation of (the potential of the anode electrode 8–the surface potential of the SiC single crystal layer 12)<the Schottky barrier between the anode electrode 8 and the SiC single crystal layer 12, no current flows between the anode electrode 8 and the cathode electrode 16.

In the state where no current flows, the following phenomena can be obtained.

(a) A depletion layer extends from the conductive layer 18 provided inside each trench 4 into the SiC single crystal layer 12. The depletion layers extending from left and right, respectively, are linked together to pinch off the semiconductor region. An electric field strength in the front surface of the SiC single crystal layer 12 is thereby satisfactorily decreased, and the leakage current is suppressed.

(b) The conductive layer 18 extends along each trench 4 in the depth direction, and hence the depletion layer also extends in the depth direction. The electric field strength in the front surface of the SiC single crystal layer 12 is sufficiently decreased, and a high effect of suppressing a leakage current is obtained.

(c) The thick deposited insulating layer 22 exists below the conductive layer 18, and hence the electric field concentration in the semiconductor substrate 6 is reduced, and a high voltage resistance can be obtained.

(d) A depletion layer spreads from the p-type region 24 to the n-type region (in the SiC single crystal layer 12), and hence the leakage current can further be suppressed, and the voltage resistance can further be increased.

(e) In addition, the potential of the p-type region 24 is not in a floating state, but is fixed to the potential of the anode electrode 8, and hence the above-described phenomena can stably be obtained. The characteristics of the SBD 2 can be prevented from changing with time.

The potential of the conductive layer 18 may be made equal to the potential of the anode electrode 8. In place of this, the potential of the conductive layer 18 may be made equal to the potential of a gate electrode not shown. In the latter case, fixing the potential of the p-type region 24 to the potential of the anode electrode 8 is particularly effective.

(f) In the latter case, there will be obtained a structure in which the p-type region 24 faces the conductive layer 18 that has a potential varying at switching, via the deposited insulating layer 22. In this case, a dielectric phenomenon occurs in the p-type region 24, depending on the potential of the conductive layer 18, causing an unstable potential of the p-type region 24. If the potential of the p-type region 24 is fixed to the potential of the anode electrode 8, the instability will not be caused.

(g) The insulating layer 22 located between the conductive layer 18 and the p-type region 24 has a large thickness, and a parasitic capacitor formed of the conductive layer 18, the insulating layer 22, and the p-type region 24 has a small capacitance. Accordingly, the potential of the conductive layer 18 (which, in this case, is equal to the potential of the gate electrode) can be changed at a high speed, and the time required for switching can be reduced.

Figure 4:
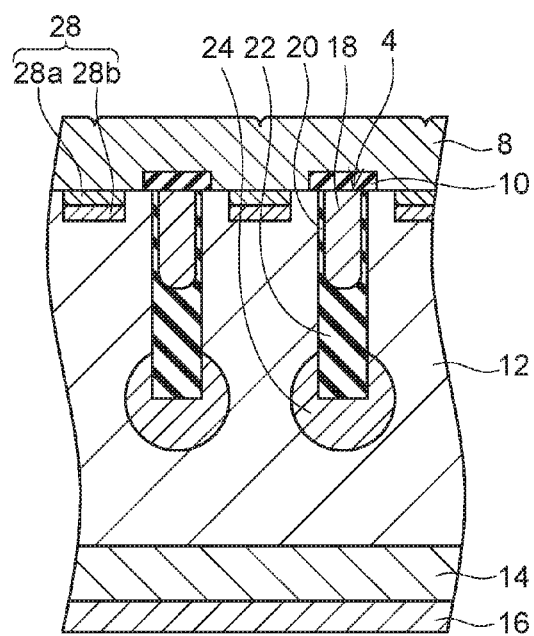
FIG. 4 shows a first variation of FIG. 2.

In First Embodiment, the trenches 4 are utilized to decrease the electric field strength. In addition to the trenches 4, an electric field reducing structure may be added thereto. FIG. 4 shows an example in which p-type regions 28 are added to a range of the semiconductor substrate 6 exposed on the front surface thereof, between the respective adjacent trenches 4. Each p-type region 28 provides an electric field reducing function. The p-type region 28 may be configured of a high-concentration impurity region 28a and a low-concentration impurity region 28b. If the high-concentration impurity region 28a is implemented, there can be obtained a relation in which the anode electrode 8 and the high-concentration impurity region 28a make ohmic contact with each other, and hence the effect of reducing the electric field is enhanced.

Figure 5:
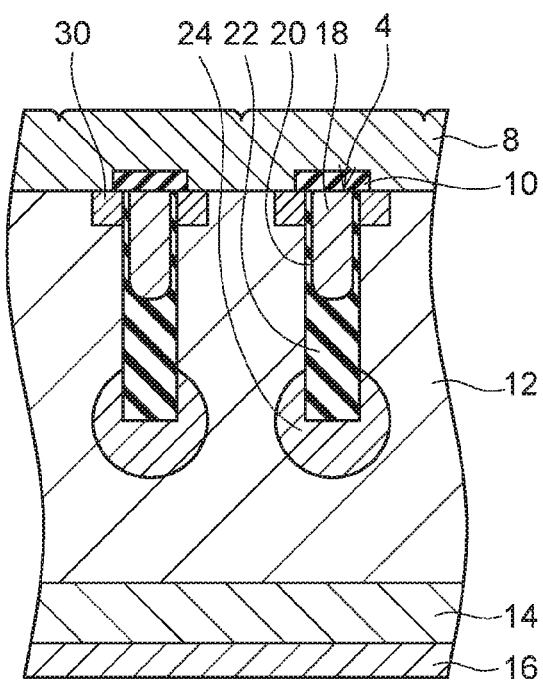
FIG. 5 shows a second variation of FIG. 2.
Figure 6:
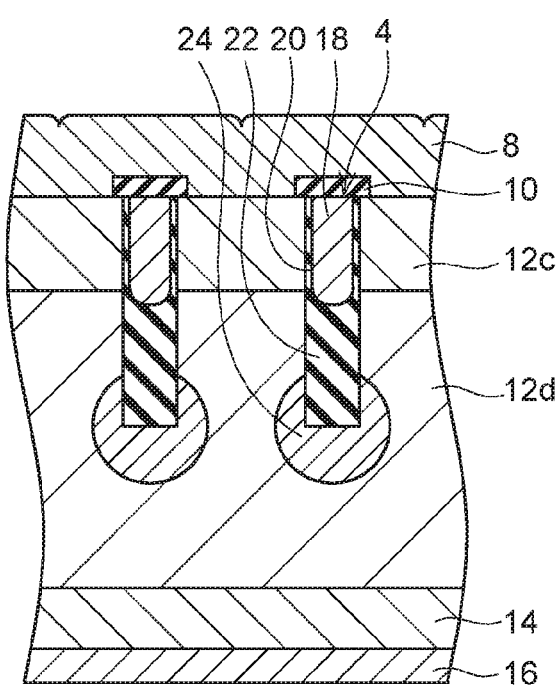
FIG. 6 shows a third variation of FIG. 2.

As shown in FIG. 5, p-type regions 30 for reducing the electric field may be provided each at a position adjacent to each trench 4. Moreover, as shown in FIG. 6, the SiC single crystal layer 12 may be configured of a stacked structure including a low-concentration impurity layer 12c and a high-concentration impurity layer 12d. Although the latter is referred to as the "high-concentration" impurity layer 12d, its impurity concentration is preferably lower than that of the SIC single crystal substrate 14.

Second Embodiment

Figure 7:
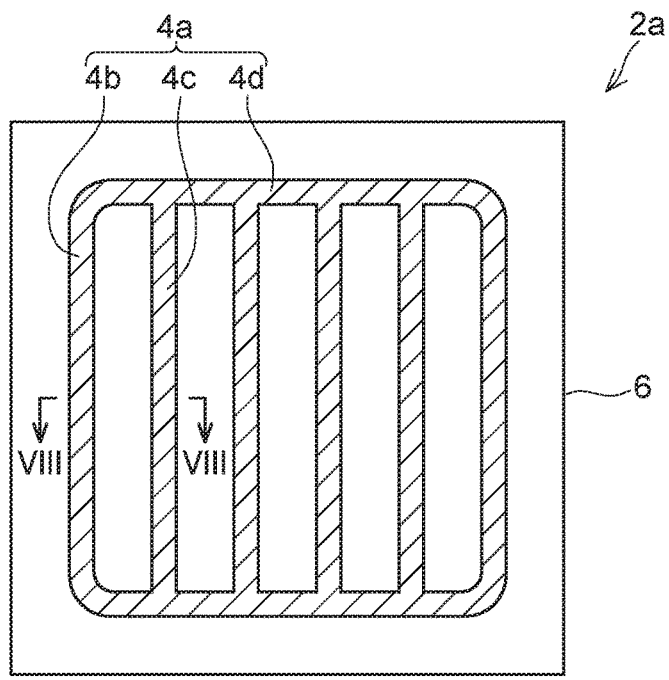
FIG. 7 is a plan view of an SBD of Second Embodiment.
Figure 8:
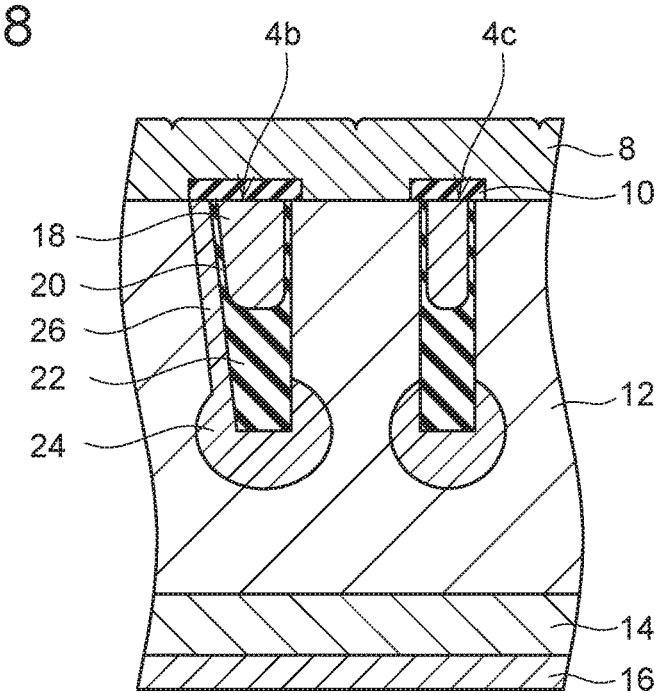
FIG. 8 is a cross-sectional view taken along a line VIII-VIII in FIG. 7.

As shown in FIG. 7, there is provided in Second Embodiment an annular trench 4d that encircles a circumference of the plurality of stripe-like trenches. In FIG. 7, outermost circumferential, stripe-like trenches 4b are distinguished from stripe-like trenches 4c that extend inside relative to each trench 4b. As shown in FIG. 8, the p-type region 24 is provided in ranges that face the bottom surfaces of each of the trenches 4b, 4c, and 4d. The p-type regions 24 provided in the ranges that face the bottom surfaces of the trenches 4b and 4c, respectively, are brought into conduction with each other by the p-type region 24 provided in the range that faces the bottom surface of the trench 4d. In this case, an outer side surface of each outermost circumferential, stripe-like trench 4b is shaped as an inclined side surface. In this case as well, the inclined side surface is inclined in a direction in which the width of the trench 4 is wider as the inclined side surface is closer to the front surface of the semiconductor substrate 6. In other words, the sidewall is inclined to be oriented diagonally upward. Consequently, by implanting impurities from the front surface side of the semiconductor substrate 6, the impurities can be implanted into a range along the inclined side surface. The reference number 26 indicates a range where p-type impurities are implanted in the range along the inclined, side surface. The range where the p-type impurities are implanted extends between the anode electrode 8 and the corresponding p-type region 24, brings the anode electrode 8 and the p-type region 24 into conduction, and makes the potential of the anode electrode 8 and the potential of the p-type region 24 equal to each other. As described above, the p-type regions 24 provided in the ranges that face the bottom surfaces of the trenches 4b, 4c, and 4d, respectively, are electrically connected to each other. The potentials of all of the p-type regions 24 are fixed to the potential of the anode electrode.

As shown in FIG. 2, the width of the p-type region 24 may be equal to the width of the bottom surface of the corresponding trench 4. Alternatively, as shown in FIGS. 4, 8, and the like, the width of the p-type region 24 may be larger than the width of the bottom surface of the corresponding trench 4. Although not shown, the width of the p-type region 24 may be smaller than the width of the bottom surface of the corresponding trench 4, or alternatively, the p-type region 24 may be divided into a plurality of regions. The width of the p-type region is not particularly limited.

Third Embodiment

Figure 9:
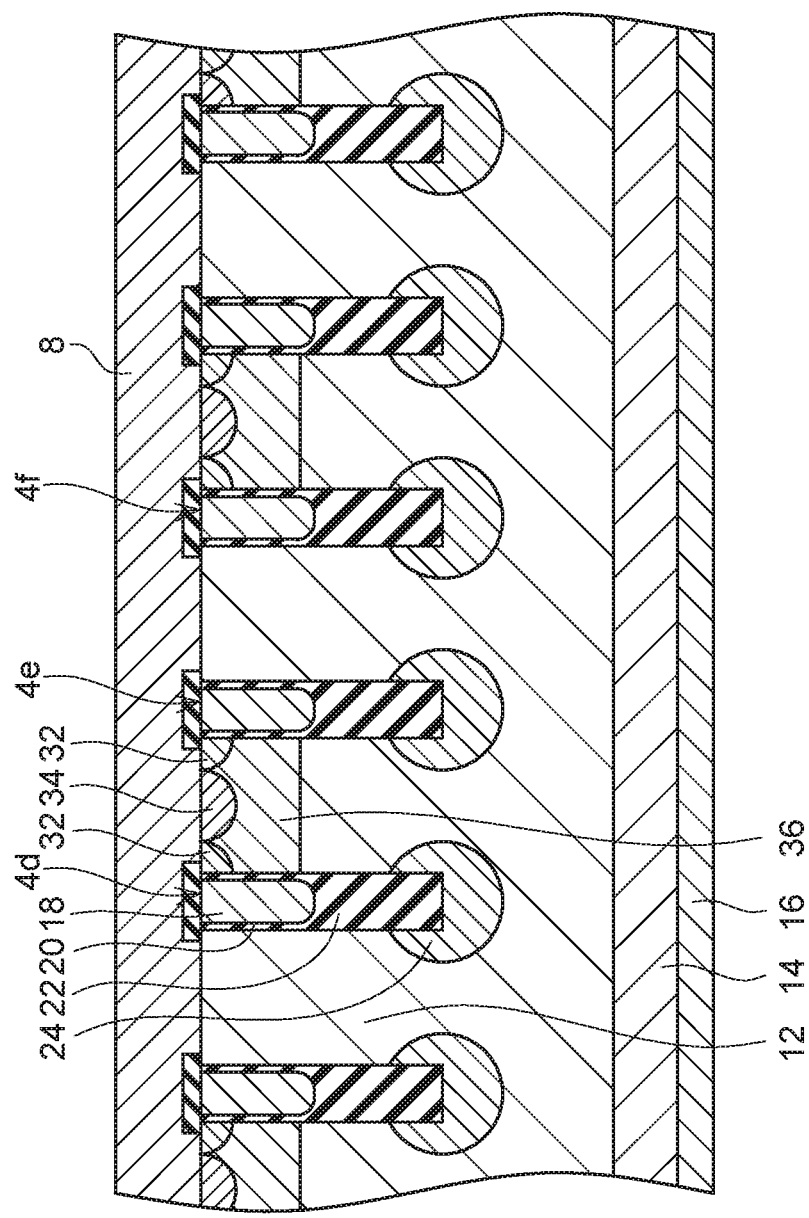
FIG. 9 is a cross-sectional view of an SBD of Third Embodiment.

FIG. 9 shows a cross-section shown in FIG. 2 in Japanese Patent Application Publication No. 2006-210392. In this cross-section, a cross-section of Third Embodiment is the same as the cross-section of the semiconductor device disclosed in Japanese Patent Application Publication No. 2006-210392, and hence the corresponding drawing of Japanese Patent Application Publication No. 2006-210392 is utilized to describe Third Embodiment. In Third Embodiment, SBDs and MOSs are provided in the same semiconductor substrate. In Third Embodiment, a plurality of SBDs and a plurality of MOSs are alternately arranged. At each boundary between the SBD and the MOS, the trench 4 is provided.

A cross-section similar to that in FIG. 2 can be observed between trenches 4e and 4f. An SBD is formed in this range, and a MOS is formed between a trench 4d and the trench 4e. In the range where the MOS is formed, source regions 32 that contain n-type impurities with a high concentration, a contact region 34 that contains p-type impurities with a high concentration, and a body region 36 that contains p-type impurities with a low concentration are provided. The SiC single crystal layer 12 becomes a drift layer of the MOS, and the SiC single crystal substrate 14 becomes a drain layer of the MOS. The anode electrode 8 also serves as a source electrode of the MOS, and the cathode electrode 16 also serves as a drain electrode of the MOS. The source regions 32 and the contact region 34 contain the impurities with the high concentration, and are in ohmic contact with the anode electrode 8 that also serves as the source electrode.

The conductive layer 18 in each trench also serves as a trench gate electrode of the MOS, and also serves as a conductive layer that suppresses the leakage current of the SBD. Namely, the conductive layer 18 serves as both of them. The conductive layer 18 is connected to a gate voltage regulating circuit not shown. The gate voltage regulating circuit outputs a voltage that changes with time, so as to turn the MOS ON/OFF. Unlike the voltage of the anode electrode 8, the voltage of the conductive layer 18 temporally changes.

In the case of Japanese Patent Application Publication No. 2006-210392, the potential of the p-type region 24 is in a floating state. In this case, the characteristics of the SBD become unstable. At switching of the MOS in particular, the potential of the p-type region 24 varies unstably, causing the characteristics of the SBD to be unstable. In the present embodiment, in contrast, the potential of the p-type region 24 is fixed to the potential of the anode electrode 8, and hence the characteristics of the SBD do not become unstable. In the case of the present embodiment, the MOS may be replaced by IGBT.

Fourth Embodiment

In Fourth Embodiment, although not shown, a region where the SBD structures that were shown in FIG. 9 are continuously arranged, and a region where the MOS structures that were shown in FIG. 9 are continuously arranged, are provided in the same semiconductor substrate. In the case of this embodiment, it is preferable that the p-type regions 24 in the SBD continuous region are brought into conduction with the anode electrode 8, and the p-type regions 24 in the MOS continuous region are brought into a floating state. Both of the characteristics of the SBD and the characteristics of the MOS can thereby be optimized, respectively. In the present embodiment as well, the MOS may be replaced by IGBT.

Figure 10:
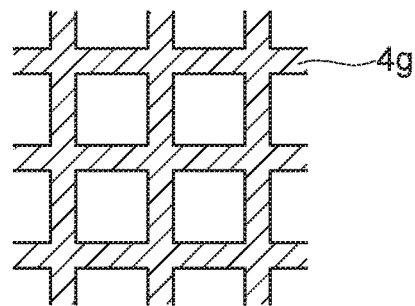
FIG. 10 is a diagram that shows planar layout example 1 of SBD trenches.
Figure 11:
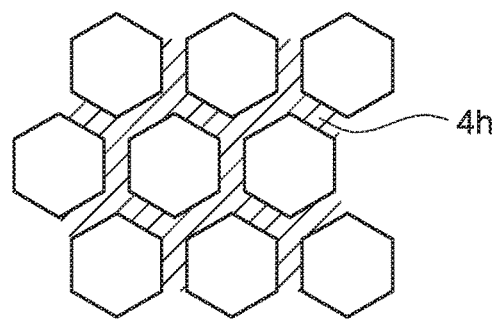
FIG. 11 is a diagram that shows planar layout example 2 of the SBD trenches.
Figure 12:
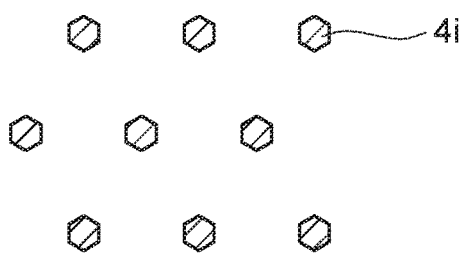
FIG. 12 is a diagram that shows planar layout example 3 of the SBD trenches.

(Planar Shape of Trenches Provided in SBD Region) Each of the layouts in the plan view in FIGS. 1 and 7 is only an example, and not limited thereto. As shown in FIG. 10, a grid-like trench 4g may be provided. As shown in FIG. 11, there may be provided a grid-like trench 4h that forms hexagons. Alternatively, as shown in FIG. 12, a collection of pillar-like trenches 4i arranged on lattice points may be provided. By bringing the p-type region provided in a range that faces the bottom surface of each trench described above into conduction with the anode electrode, the phenomena described in the present teachings can be obtained.

Specific examples of the present teachings are described above in detail, but these examples are merely illustrative and place no limitation on the scope of the patent claims. The technology described in the patent claims also encompasses various changes and modifications to the specific examples described above. The technical elements explained in the present specification or drawings provide technical utility either independently or through various combinations. The present teachings are not limited to the combinations described at the time the claims are filed. Further, the purpose of the examples shown by the present specification or drawings is to satisfy multiple objectives simultaneously, and satisfying any one of those objectives gives technical utility to the present teachings.

What is claimed is:

1. An SBD comprising:
a semiconductor substrate;
an anode electrode which is in Schottky contact with a front surface of the semiconductor substrate; and
a cathode electrode which is in ohmic contact with a rear surface of the semiconductor substrate,
wherein
a trench extending from the front surface of the semiconductor substrate toward the rear surface of the semiconductor substrate is provided in the semiconductor substrate,
an inner surface of the trench is covered with an insulating film,
an insulating layer is deposited at a deep portion of the trench having its inner surface covered with the insulating film,
a conductive layer is deposited at a shallow portion of the trench having its inner surface covered with the insulating film, and
in the semiconductor substrate, an n-type front surface region in contact with the anode electrode, an n-type rear surface region in contact with the cathode electrode, an n-type intermediate region connecting the front surface region and the rear surface region, a p-type region in contact with a bottom surface of the trench, and a conduction path connecting the p-type region to the anode electrode are provided, the conduction path making a potential of the p-type region and a potential of the anode electrode equal to each other.

2. The SBD according to claim 1, wherein
a sidewall of the trench is shaped as an inclined sidewall, the inclined sidewall being inclined in a direction in which a width of the trench is wider as the inclined sidewall is closer to the front surface, and
the conduction path is provided along the inclined sidewall.

3. The SBD according to claim 1, wherein
the SBD and a MOS are provided in the same semiconductor substrate, and
a trench gate electrode of the MOS and the conductive layer deposited at the shallow portion of the trench are at the same potential as each other.

4. The SBD according to claim 1, wherein
a plurality of the SBDs and a plurality of MOSs are alternately provided in the same semiconductor substrate, and
the conductive layers deposited at the shallow portions of the trenches serve as trench gate electrodes of the MOSs.

* * * * *